United States Patent [19]
Gilmour et al.

[11] Patent Number: 6,054,339
[45] Date of Patent: Apr. 25, 2000

[54] FUSIBLE LINKS FORMED ON INTERCONNECTS WHICH ARE AT LEAST TWICE AS LONG AS THEY ARE DEEP

[75] Inventors: Richard A. Gilmour, Colchester; Ronald R. Uttecht, Essex Junction; Erick G. Walton, South Burlington, all of Vt.

[73] Assignee: International Business Machines Corporation, Armonk, N.Y.

[21] Appl. No.: 08/810,587

[22] Filed: Mar. 4, 1997

Related U.S. Application Data

[62] Division of application No. 08/563,691, Nov. 28, 1995, Pat. No. 5,760,674.

[51] Int. Cl.⁷ .................................................. H01L 21/82
[52] U.S. Cl. ........................... 438/132; 438/601; 438/618
[58] Field of Search ................... 148/DIG. 55; 257/529, 257/724; 438/132, 601, 618, 621, 626

[56] References Cited

U.S. PATENT DOCUMENTS

| | | | |
|---|---|---|---|
| 4,774,561 | 9/1988 | Takagi | 438/601 |
| 5,618,750 | 4/1997 | Fukura et al. | 438/601 |

OTHER PUBLICATIONS

Stanley Wolf Ph.D. and Richard N. Tauber Ph.D. in Silicon Processing for the VLSI Era, vol. 1: Process Technology, Lattice Press, 1986.

Stanley Wolf Ph.D. in Silicon Processing for the VLSI Era, vol. 2: Process Integration, Lattice Press, 1990.

Minimum Groundrule, Electrically Blown Tungsten/Aluminum Fuse by Electromigration, IBM Technical Bulletin, vol. 31, No. 5, Oct. 1988.

*Primary Examiner*—Wael Fahmy
*Assistant Examiner*—William M. Brewster
*Attorney, Agent, or Firm*—Schmeiser, Olsen & Watts; Howard J. Walter

[57] ABSTRACT

A shortened fuse link is disclosed. The fuse link comprises a first and second interconnect, with interconnects each being substantially longer than deep. The interconnects are disposed toward each other with a insulator region between them. A fusible conductor, spanning the insulator region, is attached at the top of the interconnects. The present device allows the length of the fusible conductor to be shortened, and results in a fuse link that can be consistently blown with a single laser pulse. Additionally, the fuse link can be used in a staggered layout. The staggered layout of parallel fuse links allows a high number of links in a relatively small area, with or without the use of tungsten barriers, and allows accessing all fuse links through a single fuse blow window.

17 Claims, 6 Drawing Sheets

FUSIBLE LINKS FORMED ON INTERCONNECTS WHICH ARE AT LEAST TWICE AS LONG AS THEY ARE DEEP

This application is a divisional of application Ser. No. 08/563,691, filed Nov. 28, 1995, now U.S. Pat. No. 5,760,674.

BACKGROUND OF THE INVENTION

1. Technical Field

This invention generally relates to semiconductor circuit design, and more specifically relates to fuse links in semiconductor circuits.

2. Background Art

The use of fusible links (or fuse links) is a known redundancy technique utilized in most large scale semiconductor devices such as dynamic random access memory (DRAM) and static random access memory (SRAM) products. Fuse links are used to access spare bit lines and/or word lines to increase yield potential. Typically, the semiconductor device is built and then tested. Some types of flaws in the device, such as bad bit lines in a DRAM, can be repaired by blowing an appropriate fuse link. The fuse links can be polysilicon or metal and can be blown by focusing an appropriate pulse of laser energy on the target fuse. When the laser strikes, the fuse link is vaporized and evaporated upward. Unfortunately, it has been observed that in some cases the fuse link is not completely opened after being struck with the laser pulse. This may result in enough leakage current passing through the partially blown fuse link to prevent successful repair of the semiconductor device.

Fuse links are also used in semiconductor identification techniques. For this use, individual fuse links are blown as a means of encoding identification information on the semiconductor device.

FIG. 1 is a cross sectional view of a fuse link 100 taken along line 1—1 of FIG. 2, where FIG. 2 is a schematic top view of a fuse link layout 200. The fuse link 100 is part of a portion of a semiconductor device 105. Fuse link 100 includes a fusible conductor 102, interconnects 112, and metal layer 114. Additionally, a fuse blow window 104 constitutes an area in which the oxide of the semiconductor device 105 is thinned to some predetermined thickness to allow the vaporized fuse material to be exploded upward through the fuse blow window 105. The long fusible conductor 102, typically on the order of 20 microns long, will usually constitute the next to last metal layer applied in the fabrication process (last metal minus one). Interconnects 112 serve to connect fusible conductor 102 to earlier metal layer 114 (last metal minus two), which connects to the rest of the semiconductor device.

Unfortunately, these prior art fuse inks 100 cannot be consistently blown with a single laser strike. One reason they are not consistently blown is that the conductor material of fusible conductor 102 at the edges of the laser strike region is melted, but not completely vaporized. The partially melted fusible conductors can then flow together, resulting in possible leakage current across fuse link 100. To overcome this inconsistency, the current process used to blow fuses incorporates two overlapping laser strikes to enhance the probability of completely opening the link.

FIG. 2 shows a schematic top view of a prior art fuse link layout 200, where fuse link layout 200 is typically a portion of a VLSI semiconductor device. Fuse link layout 200 includes a plurality of fuse in 100, a fuse window 104, and a plurality of tungsten barriers 106.

Fuse links 100 are typically blown with two laser strikes, the impact region of the two laser strikes being regions 108 and 110 illustrated in FIG. 2. Again, the two laser strikes are used to enhance the probability of completely opening the fuse link, and to prevent leakage from occurring. When two laser strikes are used, there is typically an area of overlap as illustrated in FIG. 2. Because of the overlap, a portion of the second laser pulse passes through the cavity created by the first, and does not stop until it is absorbed by the silicon substrate. In some cases, enough energy is absorbed by the substrate to cause damage to the silicon, which can propagate up and crack the overlying insulating layers. This damage can easily mean the semiconductor device.

The use of two laser strikes also increases the probability of a laser strike hitting outside the fuse blow window. Again, if sufficient energy is absorbed by the metal fuse under the thick oxide, cracks can result in the oxide which may propagate towards the surface or toward other fuse links. Additionally, the use of two laser strikes increases the time required, and hence reduces the production throughput.

The tungsten barriers 106 are used to protect adjacent fuse links from being damaged by the laser strike and its effects. The tungsten barriers are typically fabricated in the same process that creates interconnects between the last and next to last metal layers in the device. In processes where tungsten is not available, typically because a tapered via is used as the interconnect between the last and next to last metal layers, the fuse links 100 must be spaced farther apart to prevent damage. Typically, the fuse lines in a layout without tungsten barriers 106 must be spaced twice the normal distance. This results in significantly more area being required or far fewer fuse links being available.

Therefore, there existed a need to provide a fuse link for a semiconductor device that could be consistently blown with a single laser pulse. Additionally, there existed a need to provide a layout for these fuse links in a space-efficient manner.

DISCLOSURE OF INVENTION

According to the present invention, a shortened fuse link is provided. The fuse link comprises first and second interconnects that are each substantially longer in deep. The interconnects are disposed toward each other with an insulator region between them. A fusible conductor, spanning the insulator region, is attached atop the interconnects. The interconnects preferably have a significantly higher melting point than the fusible conductor. The present invention allows the length of the fusible conductor to be shortened, and results in a fuse link that can be consistently blown with a single laser pulse.

Additionally, the fuse link of the present invention can be used in a staggered layout. The staggered layout of parallel fuse links allows a high number of links in a relatively small area, all accessible through a single fuse blow window.

The foregoing and other objects, features and advantages of the invention will be apparent from the following more particular description of preferred embodiments of the invention, as illustrated in the accompanying drawings.

BRIEF DESCRIPTION OF DRAWINGS

The preferred exemplary embodiment of the present invention will hereinafter be described in conjunction with the appended drawings, where like designations denote like elements, and:

FIG. 1 is a cross sectional side view of a prior art fuse like;

BEST MODE FOR CARRYING OUT THE INVENTION

A new and improved fuse link is provided in accordance with the present invention that can be blown consistently with a single laser strike.

Figure 3:
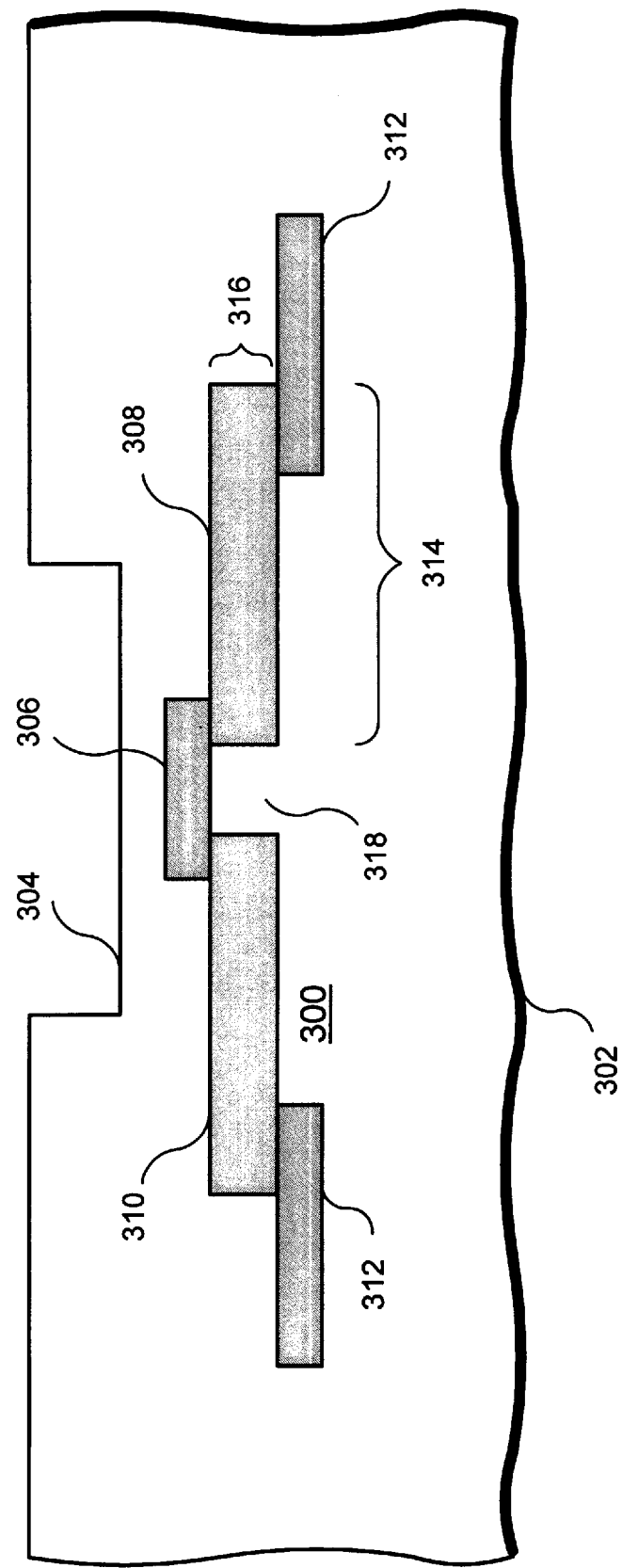
FIG. 3 is a cross sectional side view of a first fuse link in accordance with a preferred embodiment of the present invention.
Figure 4:
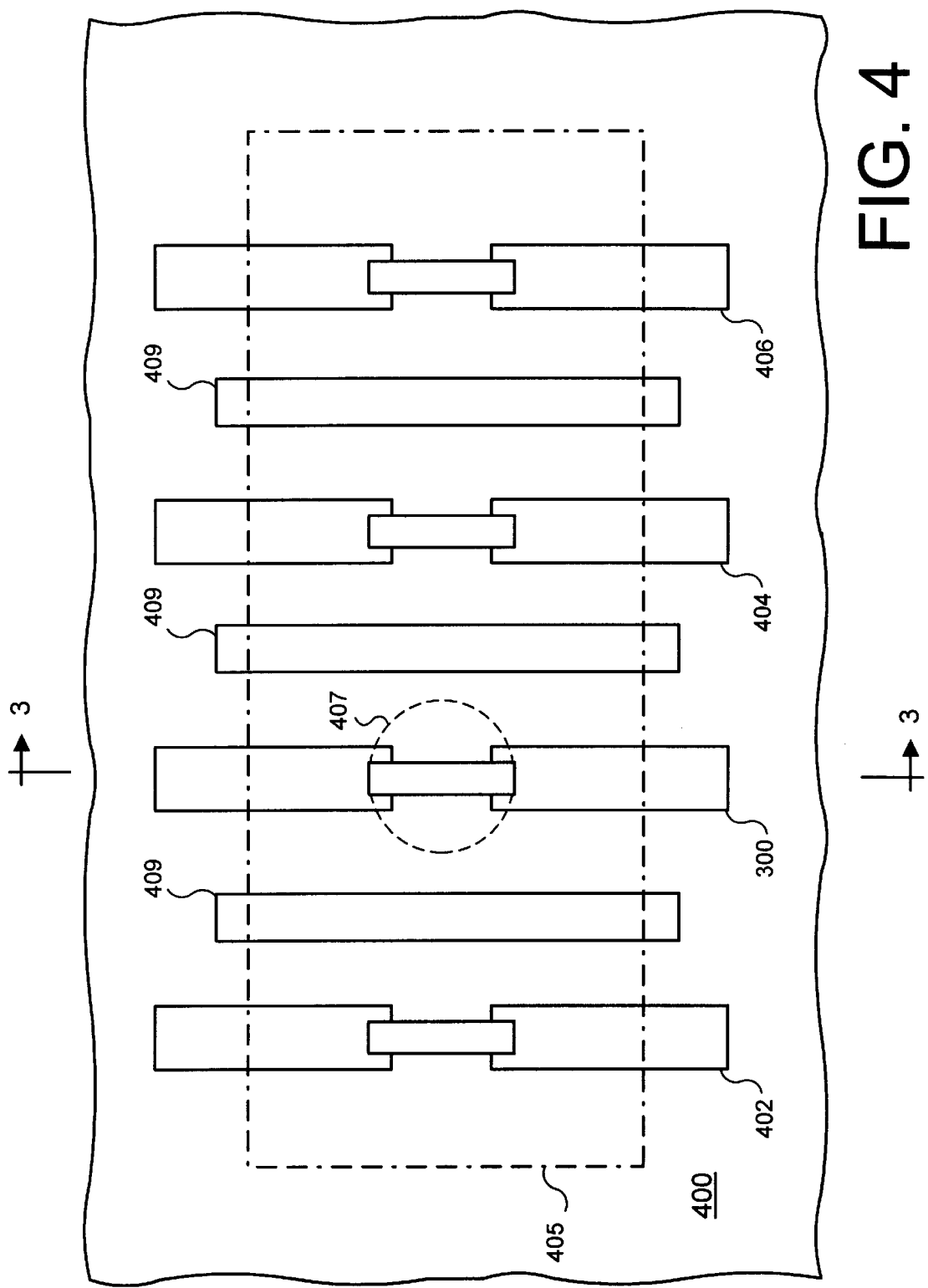
FIG. 4 is a top schematic view of a fuse link layout in accordance with a preferred embodiment of the present invention.

Referring to the figures, FIG. 3 is a cross sectional side view taken along line 3—3 of FIG. 4, of a first fuse link depicting a preferred embodiment of the present invention. A fuse link 300 is shown. Fuse link 300 is typically part of a semiconductor device, a portion of the device 302 being shown. A fuse blow window 304 is typically etched into the field oxide of the semiconductor device using well known methods. Fuse blow window 304 leaves some oxide atop fuse link 300 to protect it from being damaged and to maintain its passivation. In use, a laser is used to blow fuse link 300, and the fuse blow window 304 allows the fuse material to vaporize and explode upward through the oxide when struck with a laser strike.

Fuse link 300 comprises a fusible conductor 306, and first and second interconnects 308 and 310. Fusible conductor 306 is typically a sandwich of materials including copper, aluminum and/or titanium. Typically, fusible conductor 306 is deposited as a part of the next to last metal layer (last metal minus one) in the fabrication process. Note, however, that fusible conductor 306 may be fabricated with any material that is electrically conductive and capable of being blown by a laser strike.

The interconnects 308 and 310 of the present invention serve to connect fusible conductor 306 to the semiconductor circuit (e.g., metal layer 312). The connection is usually made to another metal layer, typically the metal layer that is deposited before the layer including fusible conductor 306 is deposited, such as last metal minus two. In FIG. 3, fusible conductor 306 is connected to metal layer 312 of the semiconductor circuit through interconnects 308 and 310. Interconnects 308 and 310 have an axial length 314 greater than their depth 316. The length 314 of the interconnects is suitably between 4 and 30 microns, preferably between 6 and 20 microns and more preferably between 8 and 14 microns. The depth 316 of the interconnects is suitably between 0.5 and 3.0 microns, preferably between 0.8 and 2.5 microns, and more preferably between 1.0 and 2.0 microns. Additionally, the width of the interconnects (not shown in FIG.) is on the order of 1 micron. The length 314 of interconnects 308 and 310 is such that fusible conductor 306 can be shorter than is possible using prior art approaches. The axial length of the fusible conductor is suitably less than 15 microns preferably less than 10 microns, and more preferably less than 6 microns. Ideally, the length of fusible conductor 306 is selected such that the fusible conductor 306 can fit entirely within the laser strike region. With fusible conductor 306 and interconnects 308 and 310 so selected, the combined axial length of interconnects 308 and 310 exceeds the axial length of fusible conductor 306.

Between interconnects 308 and 310 is an insulator region 318, that insulator region 318 being spanned by fusible conductor 306. Insulator region 318 typically includes approximately 3 microns in width of non-conductive oxide between interconnects 308 and 310. In the alternative, insulator region 318 may be filled with any suitable insulating material. Of course, as improvements in semiconductor fabrication process occur, the dimensions will vary appropriately.

In a preferred embodiment, interconnects 308 and 310 comprise materials such as tungsten, such materials characteristically having a relatively high melting point. Tungsten compositions used as interconnects typically have a melting point around 3000° C. By comparison, typical materials used in the fuse links have a melting point around 600° C. Additionally, in the preferred embodiment interconnects 308 and 310 are created using a damascene process, with a chemical-mechanical polish used to achieve a top surface with maximum planarity.

In the prior art, single laser strikes were inconsistent when used to blow the long fusible conductors, typically because conductor material at the edges of the laser strike region were melted, but not completely vaporized. The partially melted fusible conductors could then flow together, resulting in possible leakage current across the fuse link.

Conversely, in the present invention, fusible conductor 306 is much shorter, preferably selected such that its length is less and the diameter of the laser strike region. Thus, the fusible conductor 306 is completely covered by the laser strike region. This results in the entire fusible conductor being vaporized and evaporated upward. Interconnects 308 and 310, being made of a material with a high melting point (e.g., tungsten), are less likely to be significantly melted and hence are not as likely to flow together and create leakage current. The higher melting point allows interconnects 308 and 310 to absorb a greater amount of energy without melting together. This allows fusible conductor 306 to be consistently blown with a single laser strike.

Figure 1:
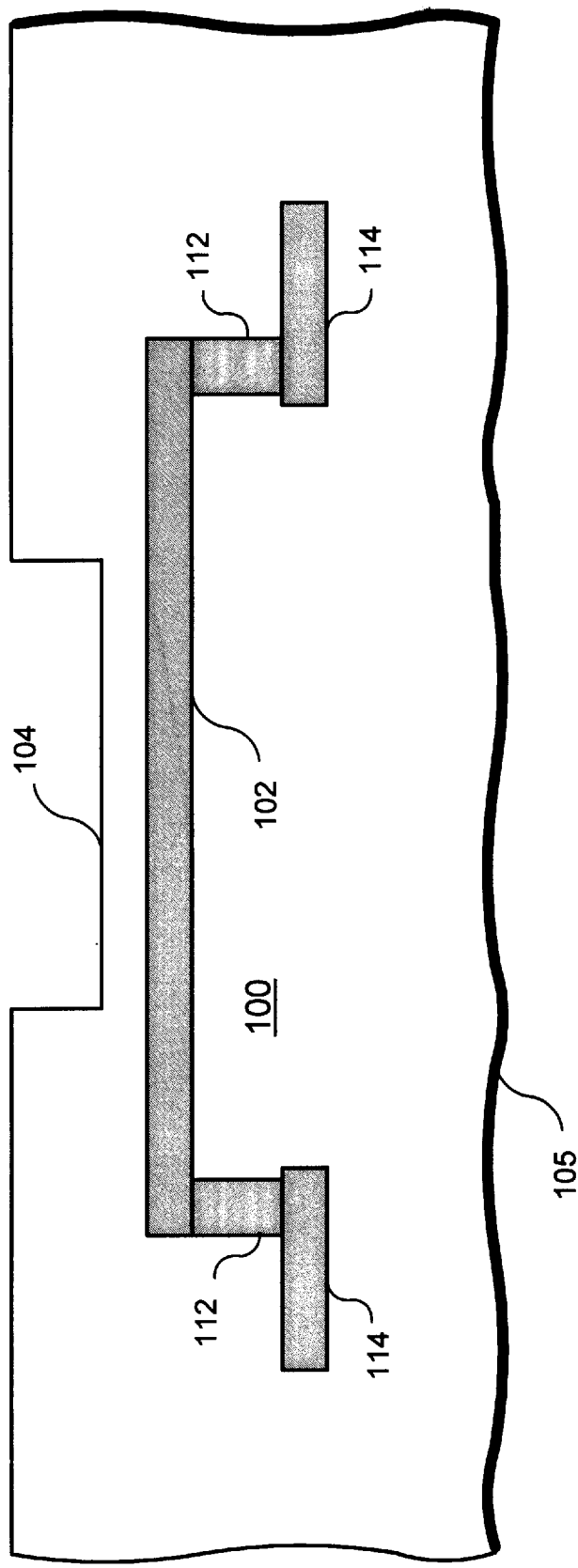
Figure 2:
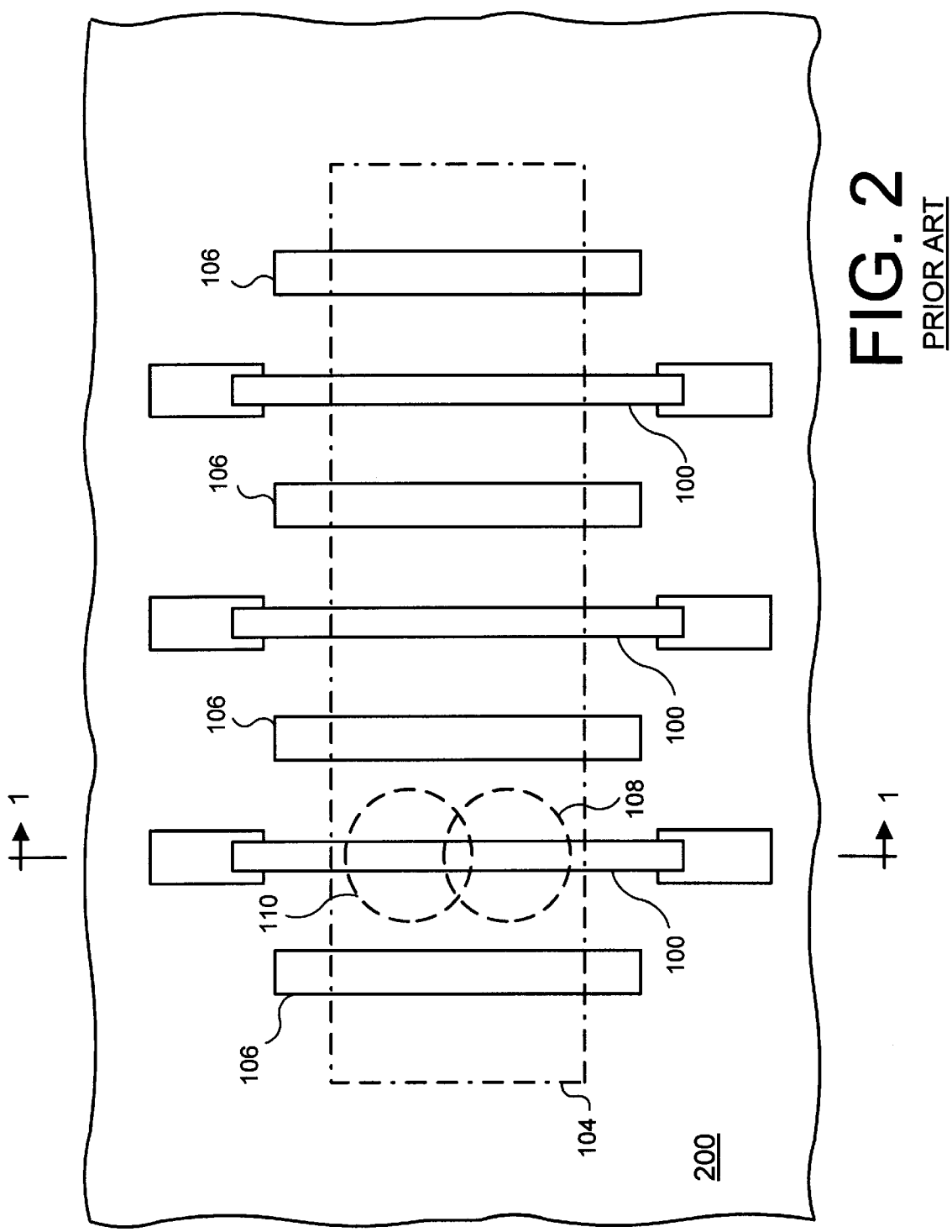
FIG. 2 is schematic top view of a prior art fuse link layout.

Turning now to FIG. 4, FIG. 4 is a top schematic view of fuse link layout 400 in accordance with an embodiment of the present invention. The layout includes a multitude of fuse links, including fuse link 300 as illustrated in FIG. 3, and fuse links 402, 404 and 406. Fuse links 402, 404 and 406 are each identical to fuse link 300. The fuse link layout 400 also comprises a multitude of tungsten barriers 409. The tungsten barriers are typically fabricated in the interconnect process that creates interconnects between the last and next to last metal layers in the device. Tungsten barriers 409 serve the same purpose as barriers 106 of FIG. 2, namely, to protect adjacent fuse link from being damaged by the laser strike. For example, when a laser strike is used to blow fuse link 300, the laser strike impacts a laser strike region 407. The adjacent tungsten barriers protect fuse link 402 and 404 from being damaged by the laser strike and its effects.

Again, fuse links 300, 402, 404 and 406 can each be blown by applying a single laser pulse through fuse blow window 405.

Figure 5:
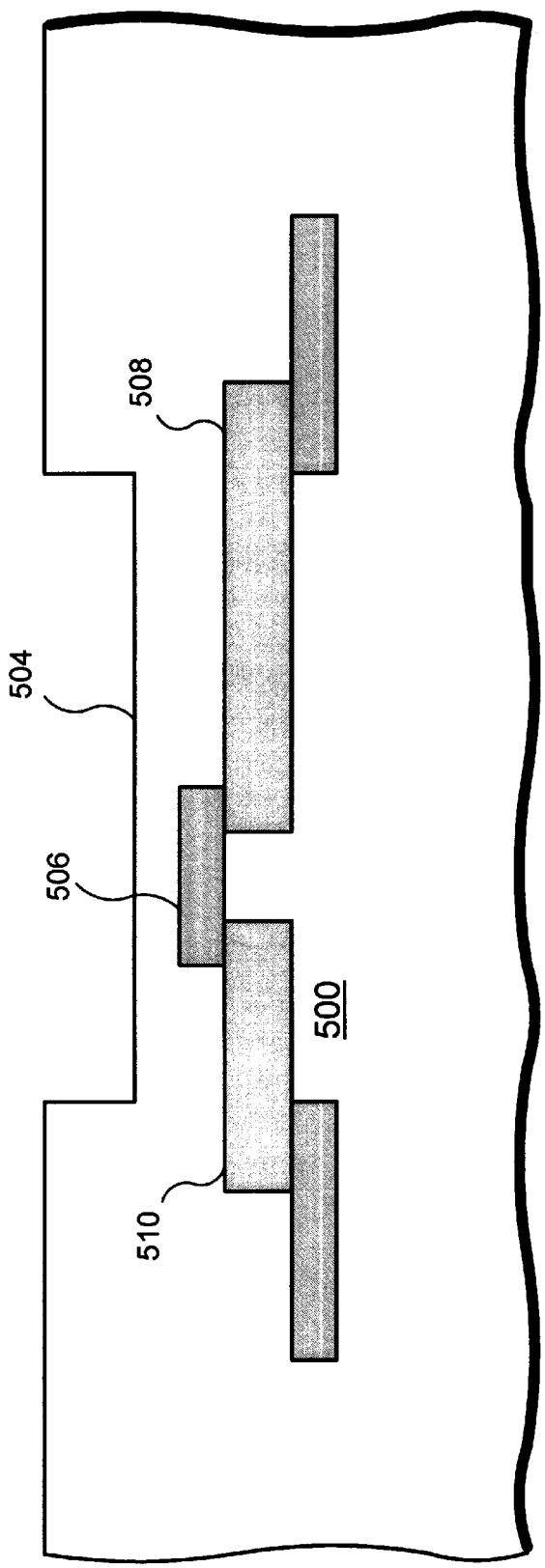
FIG. 5 is a cross sectional side view of another fuse link in accordance with a preferred embodiment of the present invention.
Figure 6:
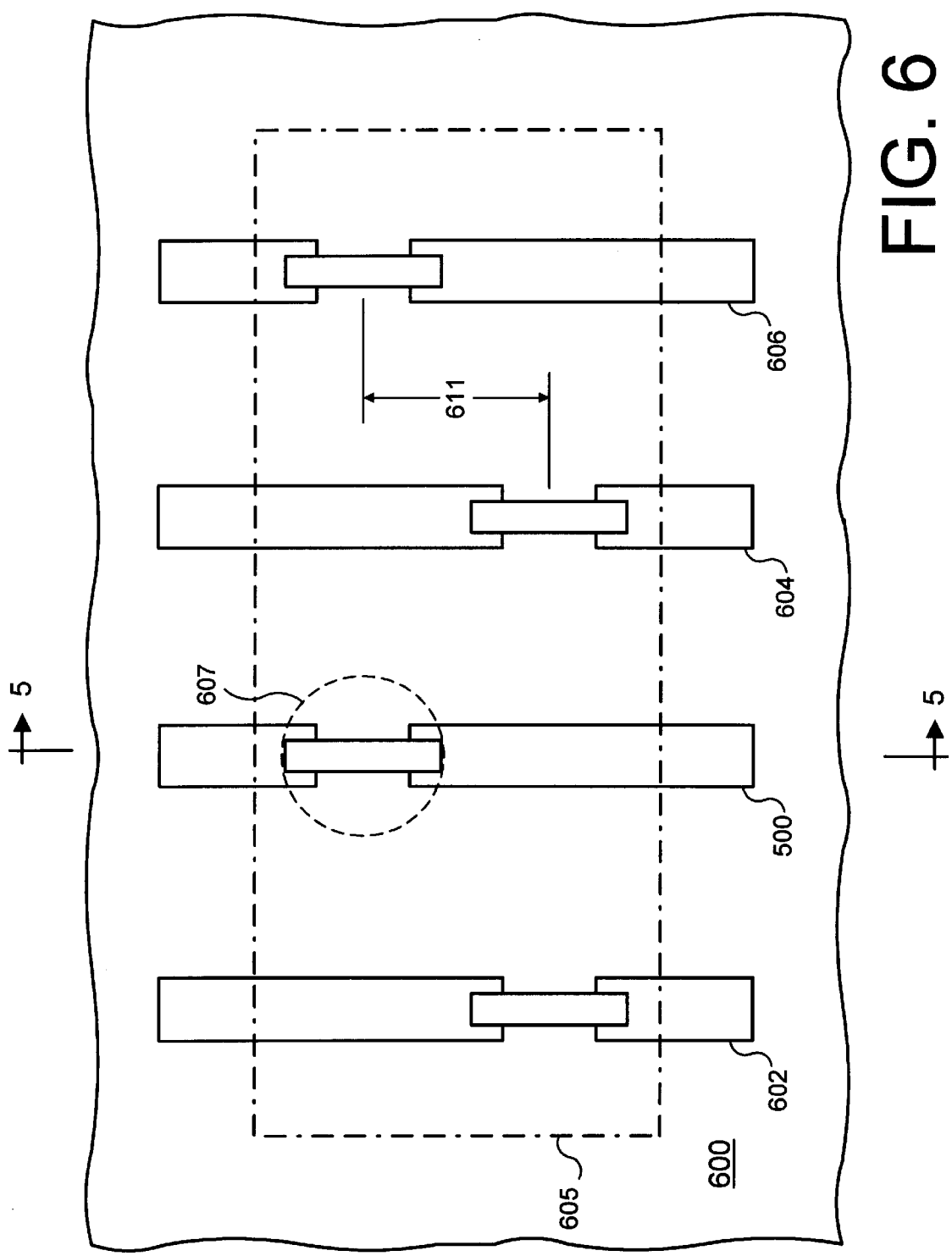
FIG. 6 is a top schematic view of a fuse link layout in accordance with a preferred embodiment of the present invention.

Turning now to FIG. 5, FIG. 5 is a cross sectional side view taken along line 5—5 of FIG. 6, of another fuse link in accordance with another embodiment of the present invention. Specifically, FIG. 5 shows another embodiment of a fuse link 500. In this embodiment, fuse link 500 comprises first and second interconnects 508 and 510 similar to interconnects 308 and 310 of the embodiment represented in FIG. 3. Interconnects 508 and 510 differ with the corresponding interconnects of FIG. 3 in that they have different lengths. First interconnect 508 is substantially longer than second interconnect 510. The length of the first interconnect is suitably between 10 to 50 microns, preferably between 14 and 36 microns, and more preferably between 18 and 26 microns. The length of the second interconnect is suitably between 4 and 30 microns, preferably between 6 and 20 microns, and more preferably between 8 and 14 microns. Again, a fusible conductor 506 is connected atop interconnects 508 and 510. Again, with fusible conductor 506 and interconnects 508 and 510 so selected, the combined axial length of interconnects 508 and 510 exceeds the axial length of fusible conductor 506. Because of the differing lengths of the interconnects, fusible conductor 506 is offset, and no longer in the middle of fuse blow window 504.

Turning now to FIG. 6, FIG. 6 is a top schematic view of fuse link layout 600 in accordance with another embodiment of the present invention. The layout includes a multitude of fuse links, including fuse link 500 as illustrated in FIG. 5.

In this embodiment, each fuse link is offset, with adjacent fuse links offset in opposite directions. Namely, fuse links 602 and 604, being adjacent fuse link 500, are each offset in an opposite direction as fuse link 500. Conversely, fuse link 606 is offset in the same direction as fuse link 500. This pattern of offsets can be expanded for fuse layouts of any size. The amount of the offset 611, measured from the center of a fusible conductor to the center of an adjacent fusible conductor, as illustrated by FIG. 6, is suitably between 6 and 20 microns, preferably between 8 and 16 microns, and more preferably between 10 and 6 microns. Offsetting adjacent fuse links in opposite directions results in a staggered arrangement of parallel fuse links.

The staggered fuse link layout 600 increases the relative distance between a laser strike region, such as region 607, and the fusible conductors of the adjacent fuse links, while maintaining a small fuse pitch, where fuse pitch is the spacing distance between adjacent fuse links. Thus fuse link layout 600 allows the individual fuse links to be have a relatively small fuse pitch, being relatively close together, without requiring barriers between adjacent fuses, such as tungsten barriers 106 of FIG. 2 and 409 of FIG. 4. This is important for processes where a tungsten barrier is not available, namely, processes that, because of cost and other reasons, have not used tungsten interconnects between the next to last and last metal layers. Otherwise, the fuse pitch would have to be increased to compensate for the lack of tungsten protection barriers.

Again, fuse links 500, 602, 604 and 606 can each be blown by applying a single laser pulse through fuse blow window 605.

In another embodiment, a staggered fuse link layout could be used that includes tungsten barriers between fuse links. Using a staggered layout in conjunction with tungsten barriers could result in a lower fuse pitch, allowing a greater density of fuse links.

While the invention has been particularly shown and described with reference to preferred exemplary embodiments thereof, it will be understood by those skilled in the art that variations in form and detail may be made therein without departing from the spirit and scope of the invention.

What is claimed is:

1. A method for fabricating a semiconductor circuit, said method comprising the steps of:
    (a) fabricating a first interconnect having a first end, said first interconnect having a length greater than twice its depth;
    (b) fabricating a second interconnect having a first end, said second interconnect having a length greater than twice its depth, said first end of said second interconnect disposed toward said first end of said first interconnect; and
    (c) fabricating a fusible conductor atop said first and second interconnects, said fusible conductor having a length less than 15 microns.

2. The fabrication method of claim 1 wherein said first and second interconnects comprise tungsten.

3. The fabrication method of claim 1 wherein said first and second interconnects comprise tungsten and wherein said first and second interconnects are processed with a chemical-mechanical polish to achieve a high top surface planarity.

4. The fabrication method of claim 1 wherein said first and second interconnects are coupled to said semiconductor circuit.

5. A method for fabricating a semiconductor device, said method comprising the steps of:
    (a) providing a semiconductor device, said semiconducting device including a plurality of fusible links, each of said fusible links comprising:
        (i) first and second interconnects, said interconnects having a length greater than twice their depth and having first ends disposed toward each other and separated by an insulator region and having second ends disposed to contact the semiconductor device; and
        (ii) a fusible conductor disposed on top of said insulator region and contacting said first ends of said interconnects;
    (b) selectively blowing at least one of said plurality of fusible links.

6. The fabrication method of claim 1 wherein said first and second interconnects each have a length between 4 and 30 microns.

7. The fabrication method of claim 1 wherein said first and second interconnects each have a length between 6 and 20 microns.

8. The fabrication method of claim 1 wherein said first and second interconnects each have a length between 8 and 14 microns.

9. The fabrication method of claim 1 wherein said fusible conductor has a length less than 10 microns.

10. The fabrication method of claim 1 wherein said fusible conductor has a length less than 6 microns.

11. The fabrication method of claim 1 wherein said fusible link is designed to be blown by the application of a laser strike, and wherein the laser strike impacts a laser strike region, and wherein said fusible conductor is chosen such that it fits entirely within said laser strike region.

12. The fabrication method of claim 5 wherein said first and second interconnects each have a length between 4 and 30 microns.

13. The fabrication method of claim 5 wherein said first and second interconnects each have a length between 6 and 20 microns.

14. The fabrication method of claim 5 wherein said first and second interconnects each have a length between 8 and 14 microns.

15. The fabrication method of claim 5 wherein said fusible conductor has a length less than 10 microns.

16. The fabrication method of claim 5 wherein said fusible conductor has a length less than 6 microns.

17. The fabrication method of claim 5 wherein said fusible link is designed to be blown by the application of a laser strike, and wherein the laser strike impacts a laser strike region, and wherein said fusible conductor is chosen such that it fits entirely within said laser strike region.

* * * * *